United States Patent
Krabbenborg et al.

(10) Patent No.: US 12,155,359 B2
(45) Date of Patent: Nov. 26, 2024

(54) DRIVER CIRCUIT ARRANGEMENT FOR DRIVING LOAD AND DIFFERENTIAL DRIVE ARRANGEMENT THEREOF

(71) Applicant: SHENZHEN GOODIX TECHNOLOGY CO., LTD., Shenzhen (CN)

(72) Inventors: Bernardus Henricus Krabbenborg, Nijmegen (NL); Lutsen Dooper, Nijmegen (NL); Han Martijn Schuurmans, Nijmegen (NL)

(73) Assignee: SHENZHEN GOODIX TECHNOLOGY CO., LTD. (CN)

( * ) Notice: Subject to any disclaimer, the term of this patent is extended or adjusted under 35 U.S.C. 154(b) by 667 days.

(21) Appl. No.: 17/469,552

(22) Filed: Sep. 8, 2021

(65) Prior Publication Data

US 2022/0077833 A1  Mar. 10, 2022

(30) Foreign Application Priority Data

Sep. 9, 2020 (EP) .................................... 20195205

(51) Int. Cl.
*H01L 41/02* (2006.01)
*H03F 1/08* (2006.01)
(Continued)

(52) U.S. Cl.
CPC .......... *H03G 1/0029* (2013.01); *H03F 1/086* (2013.01); *H04R 17/00* (2013.01);
(Continued)

(58) Field of Classification Search
CPC .............................. H10N 30/802; H04R 17/00
(Continued)

(56) References Cited

U.S. PATENT DOCUMENTS 9,647,612 B2  5/2017  Watanabe
2012/0244912 A1*  9/2012  Hiwatashi .............. H04R 17/00
                                                    455/566

(Continued)

FOREIGN PATENT DOCUMENTS

CN   105281684 A   1/2016
CN   108874008 A   11/2018
(Continued)

OTHER PUBLICATIONS

Pietro Adduci et al: "PWM Power Audio Amplifier With Voltage/Current Mixed Feedback for High-Efficiency Speakers", IEEE Transactions on Industrial Electronics, IEEE Service Center, Piscataway, NJ, USA, vol. 54, No. 2, Apr. 1, 2007, pp. 1141-1149, XP011175879, ISSN: 0278-0046, DOI: 10.1109/TIE.2007.892610.
(Continued)

*Primary Examiner* — Derek J Rosenau
(74) *Attorney, Agent, or Firm* — Emerson, Thomson & Bennett, LLC; Roger D. Emerson; Matt J. Wilson

(57) ABSTRACT

A driver circuit arrangement for driving a load and a differential drive arrangement thereof are provided. The driver circuit arrangement employs a dual feedback configuration with a feedback resistor and a current sensor feedback arrangement. The current sensor feedback arrangement provides a current feedback path from the amplifier output to the amplifier input, and has a current sensor resistor connected in an output current path of the driver circuit arrangement. A current feedback amplifier is present connected to the current sensor resistor and to the amplifier input.

20 Claims, 5 Drawing Sheets

(51) Int. Cl.
*H03G 1/00* (2006.01)
*H04R 17/00* (2006.01)

(52) U.S. Cl.
CPC ...... *H03F 2200/03* (2013.01); *H04R 2499/11* (2013.01); *H04R 2499/15* (2013.01)

(58) Field of Classification Search
USPC ........................................................ 310/317
See application file for complete search history.

(56) References Cited

U.S. PATENT DOCUMENTS

| | | | | |
|---|---|---|---|---|
| 2016/0020735 | A1* | 1/2016 | Otani | H03F 1/342 |
| | | | | 330/251 |
| 2017/0257701 | A1 | 9/2017 | Fraisse et al. | |
| 2020/0228075 | A1 | 7/2020 | Coric | |

FOREIGN PATENT DOCUMENTS

| | | |
|---|---|---|
| CN | 108899951 A | 11/2018 |
| FR | 3030983 A1 | 6/2016 |
| JP | 2016025475 A | 2/2016 |
| JP | 2016072876 A | 5/2016 |
| JP | 2019004494 A | 1/2019 |

OTHER PUBLICATIONS

Maxim Integrated Products, "MAX9788 14VP-P,Class G Ceramic Speaker Driver", Product Specification Sheet 19-0710, Rev. 3; May 2008, Sunnyvale CA, USA.

Texas Instruments Inc, "LM48580 Boomer™ Audio Power Amplifier Series High Efficiency Class H, High Voltage, Haptic Piezo Actuator / Ceramic Speaker Driver", Product Data Sheet SNAS491B—Feb. 2010—Revised Feb. 2018, Feb. 2018, Dallas, TX, USA.

Texas Instruments Inc, "TPA2100P1 19-VPP Mono Class-D Audio Amplifier for Piezo/Ceramic Speakers", Product Data Sheet SLOS595, Dec. 2008, Dallas TX, USA.

Saifullah Amir, Ronan Van Der Zee and Bram Nauta, "A Self-Oscillating Boosting Amplifier With Adaptive Soft Switching Control for Piezoelectric Transducers", IEEE Journal of Solid State Circuits, vol. 54, No. 1, Jan. 2019.

* cited by examiner

DRIVER CIRCUIT ARRANGEMENT FOR DRIVING LOAD AND DIFFERENTIAL DRIVE ARRANGEMENT THEREOF

CROSS REFERENCE

The present disclosure claims priority to European application No. 20195205.8 filed on Sep. 9, 2020, which is hereby incorporated by reference in its entirety.

TECHNICAL FIELD

The present disclosure relates to a driver circuit arrangement for driving a load, comprising an amplifier with an amplifier input and an amplifier output, wherein in operation, an input signal is provided to the amplifier input, and the amplifier output is connected to the load, the load being a capacitive load.

BACKGROUND

In prior art, a common technique to limit the large current through a load, e.g. a capacitive load, is to place an external resistor between the driver, e.g. amplifier, and the load. This is an insufficient technique as part of the power is dissipated as heat in the amplifier and external resistor, whereby only a small part of the power is driven into the load.

SUMMARY

The present disclosure seeks to provide a driver circuit arrangement for driving a load, more in particular a (high) capacitive load, such as a piezo speaker.

According to the present disclosure, a driver circuit arrangement as defined above is provided, further comprising a dual feedback configuration comprising a feedback resistor and current sensor feedback arrangement, the feedback resistor being connected between the amplifier output and the amplifier input providing a voltage feedback path, the current sensor feedback arrangement providing a current feedback path from the amplifier output to the amplifier input, and comprising a current sensor resistor connected in an output current path of the driver circuit arrangement, and a current feedback amplifier with inputs connected to the current sensor resistor and an output connected to the amplifier input.

Embodiments of the present disclosure have the advantage that the power dissipation in the amplifier is reduced by orders of magnitude, without the need of e.g. an expensive external resistor capable of dissipating the power. This results in a lower power consumption than found in state-of-the-art systems, making it possible to drive a larger load, e.g. a high capacitive load, with higher voltages and without excessive power dissipation.

BRIEF DESCRIPTION OF THE DRAWINGS

The present disclosure will be discussed in more detail below, with reference to the attached drawings, in which.

DETAILED DESCRIPTION OF EMBODIMENTS

Piezo-electric loudspeakers are favoured in applications where the form factor is important, for example, in ultra-thin smartphones. In general, piezo-electric loudspeakers form an almost perfectly capacitive load to the driver. Typical capacitance values range from 100 nF to 2 µF, whereby the impedance to a driver is inversely proportional to the (audio) signal frequency.

One application is to use the entire display of a smartphone as a loudspeaker. This is carried out by attaching a piezo-electric actuator to the back of the screen. The piezo-electric actuator converts electrical energy into mechanical energy, whereby this energy conversion is used as sound production for the loudspeaker. The large surface area of the screen improves the transformation from electrical signals to sound pressure levels (SPL) at lower audio frequencies.

Piezo-electric actuators developed for such applications are generally larger than conventional piezo-electric loudspeakers, and they tend to have a higher capacitance, for example, in the range from 5 µF to 8 µF. At a signal frequency of 1 kHz, an 8 µF capacitor has an impedance equivalent to a 20Ω resistor. At a signal frequency of 10 kHz, the 8 µF capacitor has an impedance that is a factor of 10 or lower, e.g. equivalent to a 2Ω resistor.

In order to achieve acceptable SPL, high voltages are then needed to drive the piezo-electric speaker, typically a peak-to-peak voltage of 20 V to 30 V. Consequently, the output current of the driver can become excessively high. For example, driving a 8 µF load with a peak-to-peak voltage of 30 V at a frequency of 10 kHz yields a peak current of 7.5 A. This high current, in combination with high supply voltage, can cause high power dissipation in the driver that generates heat and draws power from the supply that is not used to obtain the desired SPL.

Figure 1:
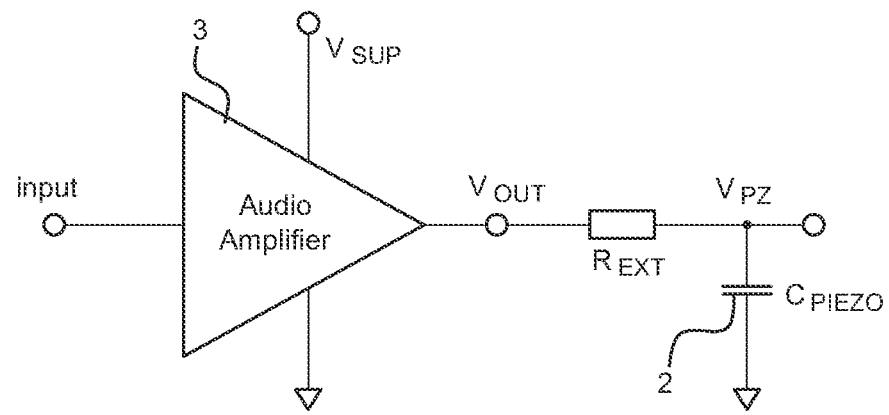
FIG. 1 shows a schematic diagram of a prior art electronic circuit configuration for driving a load.

In this respect, a common and applied technique, as known in the art, to limit the current through the piezo-electric speaker at high audio frequencies, is to place an external (series) resistor between the driver and piezo-electric speaker, as shown in an example of an electronic circuit configuration thereof in FIG. 1. In FIG. 1, the electronic circuit comprises an amplifier 3 having an input, an output voltage $V_{OUT}$ and voltage supply $V_{SUP}$, an external resistor with resistance $R_{EXT}$ and a load 2. In the example shown in FIG. 1, the amplifier 3 comprises an audio amplifier connected to ground, and the load 2 comprises a piezo-electric speaker with capacitance $C_{PIEZO}$ also connected to ground and a piezo voltage $V_{PZ}$. In typical applications, $R_{EXT}$ is in the range of 5Ω to 10Ω. The external resistor not only limits the current into the load 2, but it also relieves the amplifier 3 of a part of the high power dissipation; the external resistor absorbs the high power dissipation instead.

Figure 2:
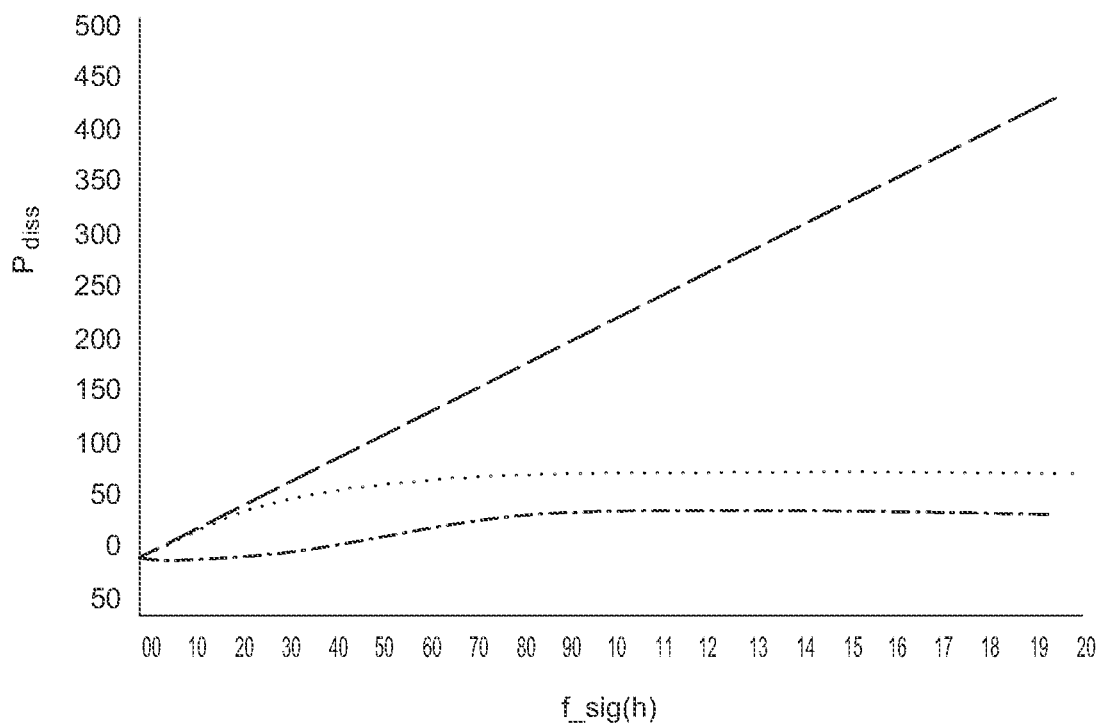
FIG. 2 shows a graph showing the power dissipation of the electronic circuit configuration in FIG. 1.

FIG. 2 shows a graph of the power dissipation (vertical axis) as a function of signal frequency (horizontal axis), illustrating the effects the electronic circuit configuration depicted in FIG. 1, with a supply voltage $V_{SUP}$ of 10 V and a load $C_{PIEZO}$ of 8 µF driven with a peak-to-peak voltage of 7 V (−3 dB of the full scale). In view of FIG. 2, the dashed line represents the total power dissipation in the amplifier 3 in the absence of an external resistor, where, as it can be seen, the power dissipation proportionally increases with the signal frequency due to the capacitive load. The dotted line represents the total power dissipation in the amplifier 3 and an external resistor with a resistance $R_{EXT}$ of 5Ω, where, as it can be seen, the dissipation is limited at higher signal frequencies. Further, the dashed-dotted line represents the power dissipation in the external resistor with a resistance $R_{EXT}$ of 5Ω only, where, as it can be seen, this amounts to about half the total power dissipation of the dotted line (even more at higher frequencies), which means that the total power dissipation is spread between the amplifier 3 and the external resistor.

Moreover, as known in the art, in order to reduce the power dissipation in the amplifier 3 even further, the amplifier 3 may comprise a high efficiency amplifier e.g. a class-G or class-H amplifier, which are often used for piezo-electric drivers. Such high efficiency amplifiers are often outfitted with e.g. a DC-DC booster or a charge pump, as to increase the output voltage $V_{OUT}$ to the high levels required by piezo-electric loudspeaker loads.

Typically, class-D amplifiers achieve the highest efficiency. In many (mobile) applications, class-D amplifiers are applied in a so-called filter-less configuration, where the loudspeaker is directly connected to the switching output nodes of the amplifier. However, this is not possible with piezo-electric loudspeakers since the capacitive impedance would result in very high peak-currents during the voltage transients of the switched output signal. Thus, an external resistor is still required, which (almost) nullifies the efficiency advantage of class-D amplifiers.

Even better efficiency can be achieved by the presence of a inductor connected in series with the piezo-electric loudspeaker. However, an external resistor is still required in this specific configuration, in order to dampen the LC-tank formed by the inductor and piezo-electric loudspeaker. The power dissipation of this specific configuration would be close to that presented by the dashed-dotted line shown in the graph of FIG. 2, as the power dissipation in the class-D amplifier can be made very small.

An alternative technique in the art to reduce the power dissipation is to use a boost converter topology to generate the audio signal across a capacitive load. This configuration has the additional advantage that the output signal can exceed the supply voltage, making it easier to create the typically high output voltage required for piezo-electric actuators. Although this configuration allows for more loop gain at higher signal frequencies, the non-linear control-to-output characteristic of this topology limits the total harmonic distortion performance.

In this regard, in the examples described above, the power consumption in the conventional piezo-electric driver solutions is largely wasted. Almost all power is dissipated as heat in the amplifier 3 and external resistor, and only a small part of the power is transformed into actual sound. In the case the amplifier 3 comprises a class-D amplifier, then almost all power is dissipated in the external resistor.

As such, there is a need in the art to overcome these drawbacks, and provide a technique to drive piezo-electric loudspeakers and piezo-electric actuators without large dissipation in e.g. an external resistor, as to increase the efficiency of the overall power consumption.

An aspect of the present disclosure provides a driver circuit arrangement for high capacitive loads, in the absence of an external resistor, whilst maintaining the same signal transfer (STF) to the piezo-electric loudspeaker. The power consumption of the driver circuit arrangements is lower than in state-of-the-art circuit configurations, making it possible to drive larger loads, e.g. capacitive loads, with higher voltages, and without excessive power dissipation.

Figure 3:
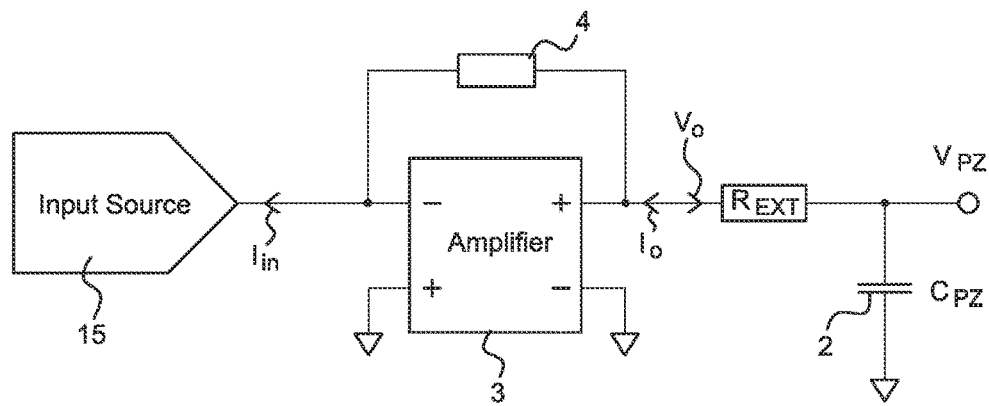
FIG. 3 shows a schematic diagram of a further prior art electronic circuit arrangement for driving a load.

To understand and describe the present disclosure embodiments, the electronic circuit arrangement shown in FIG. 3 is considered. In FIG. 3, the elements with the same function as in the electronic circuit configuration shown in FIG. 1 are indicated by the same reference numerals, whereby the electronic circuit arrangement in FIG. 3 further comprises a feedback resistor 4 with resistance value $R_{FB}$, and an input source 15 providing an input current $I_{IN}$. The amplifier 3 in this arrangement is a nullor, i.e. a theoretical component in the form of a two-port network with a nullator at its input and a norator at its output. Nullors represent an ideal amplifier, having infinite current, voltage, transconductance and transimpedance gain. In negative-feedback circuits, the circuit surrounding the nullor determines the nullor output in such a way as to force the nullor input to zero. In this circuit arrangement, the amplifier 3 has its non-inverting input terminal and inverting output terminal connected to a ground, and an external resistor with resistance value $R_{EXT}$ connects the load 2, e.g. a piezo-electric capacitor with capacitance $C_{PZ}$, to the non-inverting output terminal of the amplifier 3. An input signal is generated by the input source 15 to the inverting input terminal of the amplifier 3. A voltage feedback path is provided via the feedback resistor 4 being connected between the amplifier non-inverting output terminal and amplifier inverting input terminal. The transfer from the input current $I_{IN}$ to the output voltage Vo is proportional to the feedback resistor 4 value, and, thus, the impedance can be defined by $$\frac{V_{PZ}}{I_{IN}} = R_{FB} \cdot \frac{1}{1 + j\omega R_{EXT} C_{PZ}}, \qquad (1)$$

wherein ω is the frequency of the input signal.

Although a voltage feedback path is provided, the electronic circuit arrangement in FIG. 3 still is equivalent to the electronic circuit configuration as shown in FIG. 1, and almost all of the power is dissipated in the amplifier 3 and the external resistor.

Figure 4:
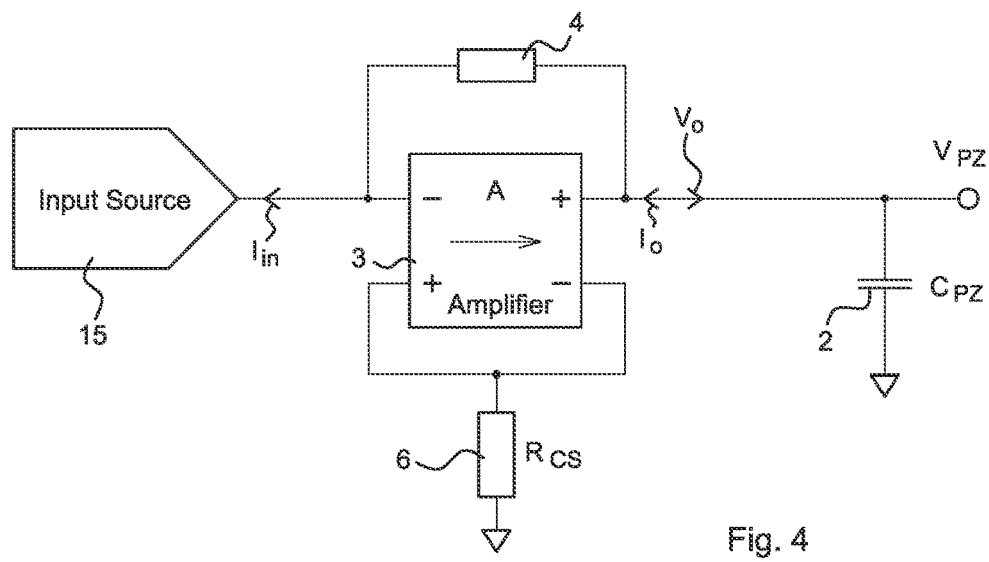
FIG. 4 shows a schematic diagram of an electronic circuit arrangement for driving a load.

To remove the external resistor, another electronic circuit arrangement, as shown in FIG. 4, is considered. In the electronic circuit arrangement shown in FIG. 4, the external resistor is no longer present, and a second feedback path has been added in the form of a current sensor resistor 6 (connected to a ground) with resistance value $R_{CS}$. An output current $I_O$ also flows through the current sensor resistor 6, whereby the voltage difference across the current sensor resistor 6 is fed back into the non-inverting input terminal of the amplifier 3.

By making the resistance $R_{CS}$ of the current sensor resistor 6 equal to the resistance $R_{EXT}$ of the external resistor in the electronic circuit arrangement shown in FIG. 3, the STF of the electronic circuit arrangement shown in FIG. 4 is identical to the first circuit arrangement shown in FIG. 3. Consequently, the output impedance in the electronic circuit arrangement shown in FIG. 4 is now equal to $$\frac{V_{PZ}}{I_{IN}} = R_{FB} \cdot \frac{1}{1 + j\omega R_{CS}C_{PZ}}. \quad (2)$$

However, the power dissipation in the current sensor resistor 6 is also identical to the power dissipation in the external resistor since the same current is flowing through identical resistances.

Figure 5:
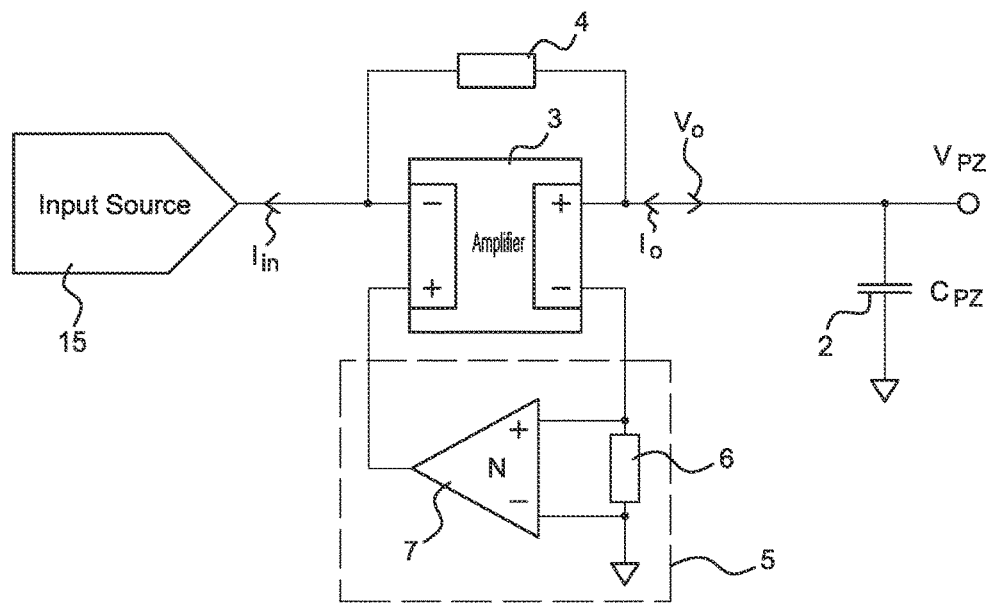
FIG. 5 shows a schematic diagram of an electronic circuit using a driver circuit arrangement according to an embodiment of the present disclosure.

To that end, FIG. 5 shows a schematic view of a driver circuit arrangement 1 for driving a load 2, according to an embodiment of the present disclosure. In this embodiment, the driving circuit arrangement 1 comprises an amplifier 3 with an amplifier input and an amplifier output, wherein in operation an input signal is provided to the amplifier input, and the amplifier output is connected to the load 2, the load 2 being a capacitive load. Similar to the circuit arrangements described above, the input signal may be generated by an input source 15. As non-limiting examples, the input source 15 may comprise a current digital-to-analogue converter, a voltage-to-current converter or a resistor. In the embodiment shown in FIG. 5, the load 2 is connected to a ground.

In a specific embodiment, the load 2 is a piezo-electric driver of a large surface. As described above, the large surface of e.g. a display screen improves the transfer from electrical signals to SPL at lower audio frequencies, generating good quality audio. In a further specific embodiment, the load 2 is a piezo-electric loudspeaker. Also described above, one application is to use the display of a smartphone as a loudspeaker, and by attaching piezo-electric loudspeakers to e.g. the back of a smartphone display, this application can be implemented efficiently.

In the embodiment shown in FIG. 5, the driver circuit arrangement 1 further comprises a dual feedback configuration, wherein the dual feedback configuration allows both a voltage and current feedback in the driver circuit arrangement 1. The dual feedback configuration comprises a feedback resistor 4, the feedback resistor 4 being connected between the amplifier output and the amplifier input and providing a voltage feedback path. In other wording, a closed feedback circuit path is present between the amplifier output and amplifier input for voltage feedback purposes, and the feedback resistor 4 has a resistance value $R_{FB}$, selected to provide a desired feedback loop for the amplifier 3.

The dual feedback configuration further comprises a current sensor feedback arrangement 5, the current sensor feedback arrangement 5 providing a current feedback path from the amplifier output to the amplifier input. In other wording, in addition to the voltage feedback path, a further closed feedback circuit path is present between the amplifier output and amplifier input for current feedback purposes.

The current sensor feedback arrangement 5 comprises a current sensor resistor 6 connected in an output current path of the driver arrangement 1, and a current feedback amplifier 7 with inputs connected to the current sensor resistor 6 and an output connected to the amplifier input. In this embodiment, the current sensor resistor 6 is connected to a ground, and the output current $I_O$ flowing on the output current path of the driver arrangement 1, and, thus, flows through the current sensor resistor 6. The output current amplifier 7 comprises an inverting input and non-inverting input, whereby both the inverting and non-inverting inputs are connected to the current sensor resistor 6, as to amplify and feed the voltage difference across the current sensor resistor 6 due to the output current $I_O$ back into the non-inverting input terminal of amplifier 3.

In the embodiment shown in FIG. 5, the current sensor resistor 6 has a resistor value equal to $R_{EXT}/N$, wherein $R_{EXT}$ is an output impedance value associated with a predetermined signal transfer function of the driver circuit arrangement 1, and N is an amplification factor of the current feedback amplifier 7. In one or more disclosure embodiments of the disclosure, $R_{EXT}$ is a value similar to the resistance values of external resistors as found in state-of-the-art electronic circuits between the amplifier and e.g. a piezo-electric speaker, e.g. as described above for FIG. 1.

Since the current sensor resistor 6 has a resistance value $R_{EXT}$ divided by N, the voltage across the current sensor resistor 6 is also divided by N This can be corrected to obtain a correct voltage on the amplifier input by inserting a gain of N, via the current feedback amplifier 7, in the current feedback path before being fed into the non-inverting input terminal of amplifier 3.

In this respect, when considering the output impedance of the driver circuit arrangement 1 in the embodiment shown in FIG. 5, this is equal to e.g. the resistance value $R_{EXT}$ in the state-of-the-art circuit configuration shown in FIG. 1. Thus, the STF of the driver circuit arrangement 1 in the FIG. 5 embodiment is equal to the STF of the FIG. 1 state-of-the-art circuit configuration. However, unlike the FIG. 1 state-of-the-art circuit configuration, the output impedance of the driver circuit arrangement 1 is not a physical resistor, and, thus, it only dissipates power over the current sensor resistor 6, i.e. a factor N lower. This results in a driver circuit arrangement 1 that is capable of driving a load 2, e.g. a highly capacitive load, with low external impedance and low power dissipation.

In more general wording, the embodiments as described herein all relate to a driver circuit arrangement 1 for driving a load 2, comprising an amplifier 3 with an amplifier input and amplifier output, and the amplifier output connected to the load 2, the load being a capacitive load 2, a dual feedback configuration comprising a feedback resistor 4 and a current sensor feedback arrangement 5, the feedback resistor 4 being connected between the amplifier output and the amplifier input and providing a voltage feedback path, the current sensor feedback arrangement 5 providing a current feedback path from the amplifier output to the amplifier input, and comprising a current sensor resistor 6 connected in an output current path of the driver circuit arrangement 1, and a current feedback amplifier 7 with inputs connected to the current sensor resistor 6 and an output connected to the amplifier input.

In further embodiments, a driver circuit arrangement 1 for driving a load 2 is provided, comprising an amplifier 3 with an amplifier input and amplifier output, and the amplifier output connected to the load 2, the load being a capacitive load 2, a dual feedback configuration comprising a feedback resistor 4 and a current sensor feedback arrangement 5, the feedback resistor 4 being connected between the amplifier output and the amplifier input and providing a voltage feedback path, the current sensor feedback arrangement 5 providing a current feedback path from the amplifier output to the amplifier input, and comprising a current sensor resistor 6 connected in an output current path of the driver circuit arrangement 1, and a current feedback amplifier 7 with inputs connected to the current sensor resistor 6 and an output connected to the amplifier input, wherein the current sensor resistor 6 has a resistor value equal to $R_{EXT}/N$, wherein $R_{EXT}$ is an output impedance value associated with a predetermined signal transfer of the driver circuit arrangement 1, and N is an amplification factor of the current feedback amplifier 7. These embodiments provide a driver circuit arrangement 1 that reduces power dissipation in the amplifier 3 by at least the factor N, which may be in orders of magnitude, in the absence of the normally present (expensive) external resistor. Furthermore, the power consumption in the driver circuit arrangement 1 is lower than in state-of-the-art circuit configurations, making it possible to drive a large load, e.g. a large capacitive load, with higher voltages and without excessive power dissipation.

In a further embodiment shown in FIG. 5), the amplifier input comprises an input inverting terminal (indicated in the figures as −) and input non-inverting terminal (indicated in the figures as +), and the amplifier output comprises an output inverting terminal (indicated in the figures as −) and output non-inverting terminal (indicated in the figures as +), wherein the feedback resistor 4 is connected between the output non-inverting terminal and the input inverting terminal, and the current sensor feedback arrangement 5 is connected between the output inverting terminal and the input non-inverting terminal. Alternatively stated, the amplifier 3 in this embodiment is a generic nullor, i.e. an ideal amplifier with infinite current and voltage gain, as discussed above.

In this embodiment, the voltage feedback path is provided between the amplifier output non-inverting terminal and input inverting terminal and the current feedback path is provided between the amplifier output inverting terminal and input non-inverting terminal.

In this respect, by e.g. modelling the amplifier 3 as a nullor, the analysis of the modelling is greatly simplified, and this leads to simple design and effective operation of the driver circuit arrangement 1.

In an exemplary embodiment, the output impedance value $R_{EXT}$ has a value between 5Ω and 10Ω. The output impedance value $R_{EXT}$ is associated with a predetermined signal transfer function (STF) of the driver circuit arrangement 1, and as explained in the example electronic circuit configuration in FIG. 1, it is a common technique to employ an external resistor. Selecting a resistance value between 5Ω to 10Ω will limit the current through the load 2, e.g. a piezoelectric speaker. Thus, an output impedance with a value between 5Ω to 10Ω would yield the same STF as in state-of-the-art circuit configurations. For example, if the circuit configuration in FIG. 1 comprises an external resistor with 5Ω resistance value, an output impedance value $R_{EXT}$ of 5Ω is chosen for the driver circuit arrangement 1 as to yield the same STF for the circuit configuration in FIG. 1.

In another exemplary embodiment, the amplification factor N has a value between 10 and 1000, e.g. 200. The amplification factor N is chosen such that the factor $R_{EXT}/N$, i.e. the resistance value of the current sensor resistor 6, represents an optimal balance between the signal level and power dissipation in the driver circuit arrangement 1. In other wording, the value of the amplification factor N is dependent on the balance between the sensitivity of the current feedback arrangement 5 and power dissipation.

As a non-limiting example, if the output impedance value $R_{EXT}$ and amplification factor N are chosen to be 5Ω and 200, respectively, than the current sensor resistor 6 has a resistance value $R_{EXT}/N$ equal to 25 mΩ. This can be considered to be negligible dissipation when compared to an external resistor with a resistance value of e.g. 5Ω, detailing the advantages of the driver circuit arrangement 1 and the technical effect of low power dissipation.

In a further exemplary embodiment, the capacitive load has a value between 1 μF and 8 μF. As described above, in order to use the entire display of e.g. a smartphone as a loudspeaker, piezoelectric actuators are attached to the back of the display, whereby such piezo-electric actuators have a capacitance in the range between e.g. 5 μF and 8 μF. In this manner, by allowing the capacitive load to have a value between 1 μF and 8 μF in this embodiment, this is representative of a large surface piezo-electric loudspeaker, allowing the driver circuit arrangement 1 to be capable of such an application.

Figure 6:
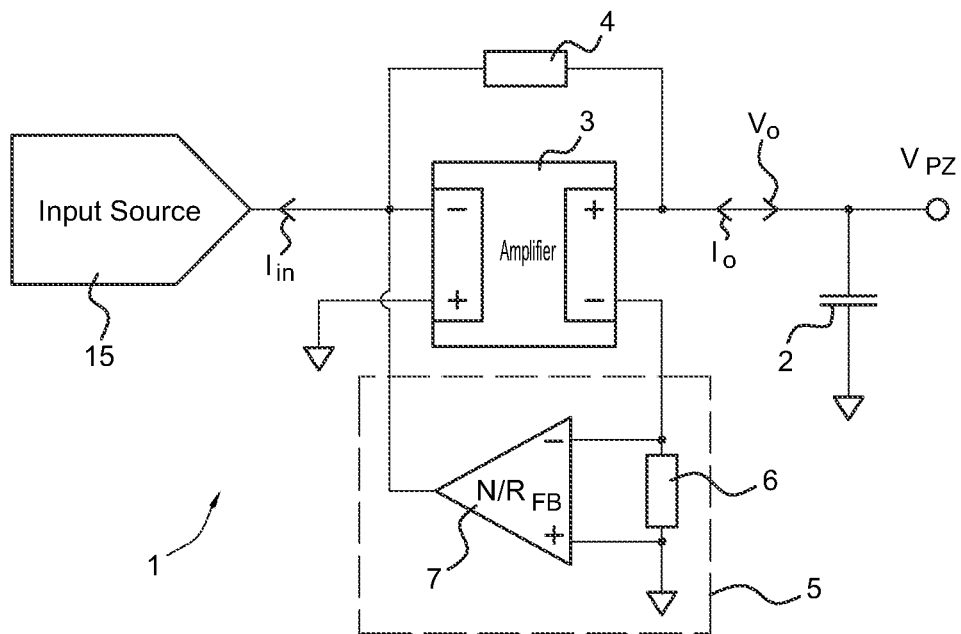
FIG. 6 shows a schematic diagram of an electronic circuit using a driver circuit arrangement according to a further embodiment of the present disclosure.

In a further embodiment shown in FIG. 6, as an alternative to the embodiment shown in FIG. 5, the amplifier input comprises an input inverting terminal and input non-inverting terminal, and the amplifier output comprises an output inverting terminal and output non-inverting terminal, the input inverting terminal being connected to ground, wherein the feedback resistor 4 is connected between the output non-inverting terminal and the input inverting terminal, and the current sensor feedback arrangement 5 is connected between the output inverting terminal and the input inverting terminal.

In further embodiments shown in FIG. 6, the current feedback amplifier 7 has a secondary multiplication factor equal to $N/R_{FB}$, $R_{FB}$ being the value of the feedback resistor 4. In this embodiment, the input non-inverting terminal is connected to ground. The amplifier 3 is also a generic nullor, i.e. an ideal amplifier, and a current injection feedback is implemented at a node formed at the input inverting terminal of the amplifier 3. In further embodiments N has a value between 10 and 1000, e.g. 200, and/or the capacitive load has a value between 1 μF and 8 μf.

To elaborate this embodiment, the sensed voltage over the current sensor resistor 6 is amplified by a factor $N/R_{FB}$, converted into a feedback current which is then injected at the input inverting terminal. In this manner, a current injection path is provided to the same virtual node as the voltage feedback path through the feedback resistor 4. Because of amplifier 3 (nullor) operation, the current feedback amplifier 7 in this embodiment has a multiplication factor including the value $1/R_{FB}$ dependent on the feedback resistor 4 value.

Figure 7:
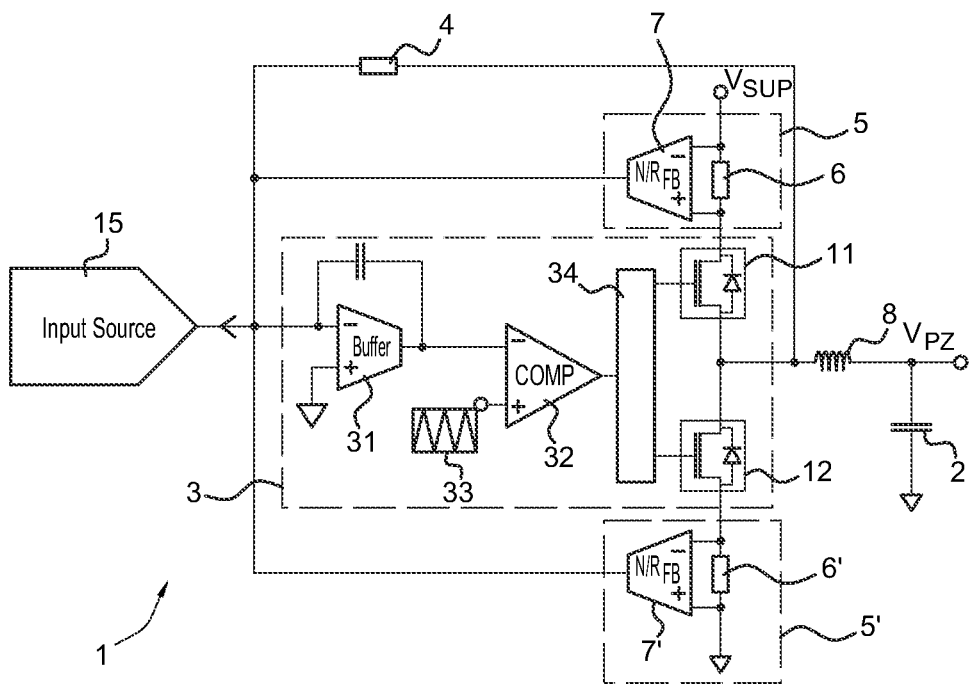
FIG. 7 shows a schematic diagram of an electronic circuit using a driver circuit arrangement according to an even further embodiment of the present disclosure.

In an even further embodiment shown in FIG. 7, the amplifier 3 is a class-D amplifier having a high side power FET 11 connected to the amplifier output and to a supply voltage via a high side current path, and a low side power FET 12 connected to the amplifier output and to a ground via a low side current path, wherein both the high side current path and the low side current path are provided with a current sensor feedback arrangement 5, 5'. Further, in this embodiment, the feedback resistor 4 is connected between the amplifier input and output as to provide a voltage feedback path. As known to the person skilled in the art, a class-D amplifier is an electronic amplifier that operates as an 'electronic switch', and as already described herein, the highest efficiency can be achieved by using a class-D amplifier.

In the embodiment shown in FIG. 7, the class-D amplifier 3 comprises an input receiving an input signal, and a buffer 31, a comparator 32 connected to a signal generator 33, and an output stage 34, whereby the operation of the features thereof are known to those skilled in the art.

In operation, the output signal from the output stage 34 flows through either the high side power FET 11 via a high side current path, or the low side current FET 12 via a low side current path. Thus, only either the high side power FET 11 or the low side current FET 12 is conducting at any given time, and this can be considered the 'electronic switch' feature of the class-D amplifier 3. In this manner, the power dissipation occurs either in the high side power FET 11 or the low side current FET 12, whereby almost no dissipation occurs. This provides a high efficiency class-D amplifier 3 for the operation of the driver circuit arrangement 1.

Figure 8:
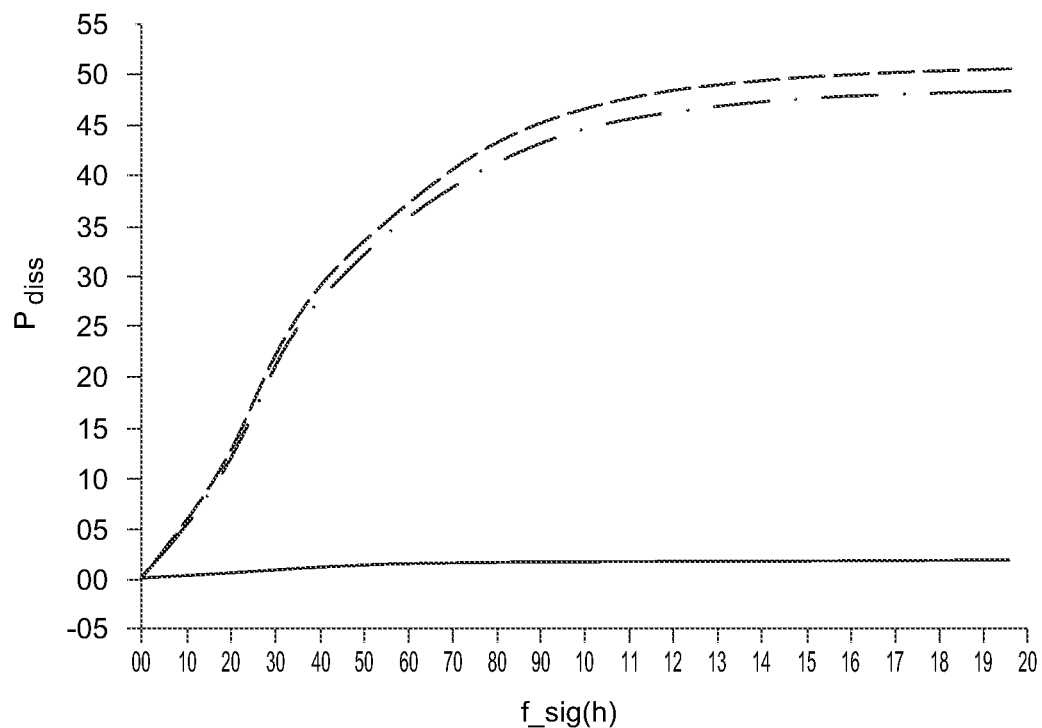
FIG. 8 shows a graph of the power dissipation versus frequency of the driver circuit arrangement of FIG. 7.

FIG. 8 shows a graph of the power dissipation of the driver circuit arrangement 1 in the embodiment shown in FIG. 7, with a supply voltage $V_{SUP}$ of 10 V and a load of 8 µF driven with a signal peak-to-peak amplitude of 7V. Power dissipation is on the vertical axis and signal frequency is on the horizontal axis. In the graph of FIG. 8, the dashed line presents the combined power dissipation of a generic class-D amplifier and a 5Ω external resistor, the dashed-dotted line presents the power dissipation in a 5Ω external resistor only, and the solid line presents the power dissipation of the dual feedback configuration in the FIG. 7 embodiment. As it can be seen, the power dissipation in the dual feedback configuration is much lower across the range of signal frequencies shown.

Figure 9:
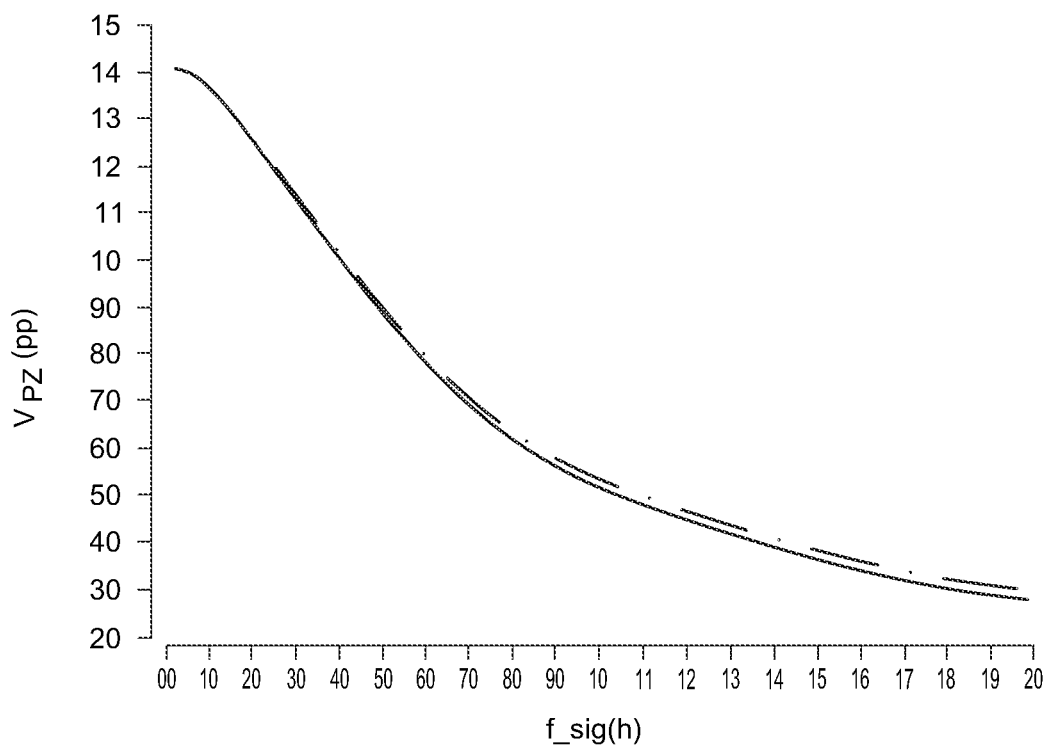
FIG. 9 shows a graph of the signal transfer function of the driver circuit arrangement in FIG. 7.

FIG. 9 shows a STF of the driver circuit arrangement 1 in the embodiment shown in FIG. 7, with peak-to-peak voltage on the vertical axis and signal frequency on the horizontal axis. The dashed line presents the STF of an exemplary prior art configuration using an external resistor, and the continuous line presents the STF of the dual feedback configuration in the FIG. 7 embodiment. As it can be seen, the STF from both the external resistor and the dual feedback configuration are almost identical, illustrating the technical effects of the dual feedback configuration with an almost identical STF.

Figure 10:
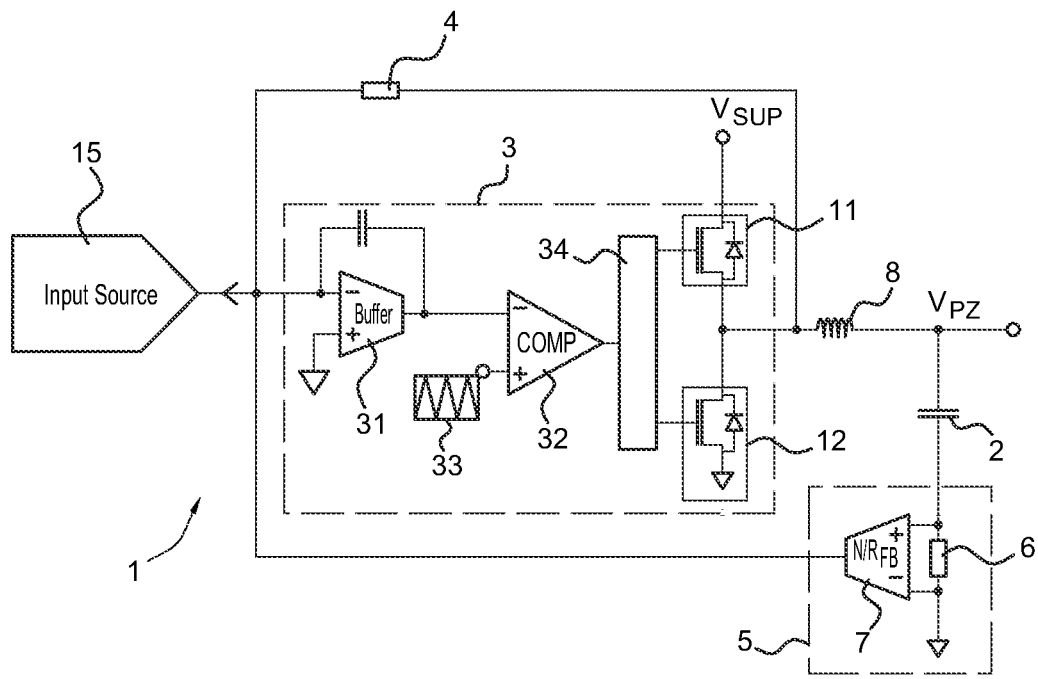
FIG. 10 shows a schematic diagram of an electronic circuit using a driver circuit arrangement according to an even further embodiment of the present disclosure.

FIG. 10 shows a schematic diagram of a driver circuit arrangement 1, according to a further embodiment. In this embodiment, the amplifier 3 is a class-D amplifier having a high side power FET 11 connected to the amplifier output and to a supply voltage via a high side current path and a low side power FET 12 connected to the amplifier output to a ground via a low side current path, the current sensor resistor 6 of the current sensor feedback arrangement 5 being provided in series between the load 2 and the ground. The feedback resistor 4 is connected between the amplifier output and amplifier input.

The embodiment shown in FIG. 10 presents an alternative case for the embodiment shown in FIG. 7, with the additional advantage that it prevents the use of two separate measurements in the high side power FET 11 via the high side current path and the low side power FET 12 via the low side current path to provide the current feedback path from the amplifier output to the amplifier input. If the value of current sensor resistor 6 is sufficiently small (as discussed above), the effect on operation of driving the load 2 is negligible.

In a specific embodiment relating to the embodiments shown in FIGS. 7 and 10, the class-D amplifier 3 comprises a first order PWM feedback loop. The first order PWM feedback loop relates to the pulsed signal generated by the signal generator 33, which e.g. generates a saw tooth signal of a single, fixed frequency. For even better amplification of the input signal to drive the load 2, a further embodiment is provided, wherein the class-D amplifier 3 comprises a second or higher order PWM feedback loop of. This allows e.g. to use varying pulse density and delta sigma modulation, as to generate a more complex signal for driving the high and low side power FETs 11, 12.

In even further embodiments, the driver circuit arrangement 1 further comprises an external inductor 8 connected between the amplifier output and load 2. The external inductor 8 tunes the frequency response of the combination of external inductor 8 and the load 2, to provide a signal to the load 2 with minimum distortion. This is particularly advantageous if the input signal comprises e.g. an audio signal with many frequencies.

Figure 11:
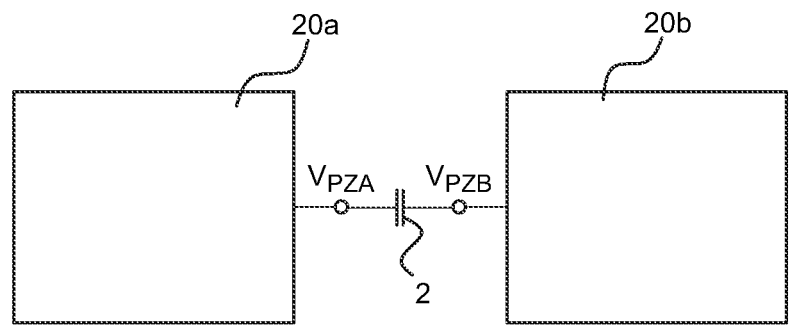
FIG. 11 shows a schematic view of a differential drive arrangement, according an embodiment of the present disclosure.

FIG. 11 shows a schematic diagram of an differential drive arrangement, according to a further aspect of the disclosure. The further aspect relates to a differential drive arrangement for driving a load 2 having two terminals, comprising a driver circuit arrangement 1 for each of the two terminals. In view of FIG. 11, the features 20A and 20B are used to denote circuitry similar to the circuitry shown in the embodiments of FIGS. 5-7 and 10 as described above, and the two terminals of the load 2 are denoted by $V_{PZA}$ and $V_{PZB}$. This further aspect relates to a bridge-tied load (BTL) configuration. The output impedance of this differential drive arrangement is equal to $$\frac{V_{PZA} - V_{PZB}}{I_{IN}} = 2 \cdot R_{FB} \cdot \frac{1}{1 + j\omega R_{CS} C_{PZ}}, \quad (3)$$

wherein $C_{PZ}$ is the capacitance of the load 2.

As known to those skilled in the art, the BTL configuration allows the output of e.g. two amplifiers to be combined so as to increase the amount of power available. Thus, the BTL configuration in FIG. 11 combines the output from the driver circuit arrangements 20A, 20B for driving the load 2. In particular, the driver circuit arrangements 20A, 20B have different voltage swings, e.g. positive and negative voltage swings. To this end, in a further embodiment relating to this further aspect in FIG. 11, the load is driven with opposite phase signals, i.e. the signals presented to the load 2 from the driver circuit arrangements 20A, 20B are in anti-phase. This allows maximum output to the load 2, allowing maximum efficiency of the differential drive arrangement.

Embodiments of the present disclosure have been described above with reference to a number of exemplary embodiments as shown in the drawings. Modifications and alternative implementations of some parts or elements are possible, and are included in the scope of protection as defined in the appended claims.

What is claimed is:

1. A driver circuit arrangement for driving a load, comprising
   an amplifier with an amplifier input and an amplifier output, wherein in operation an input signal is provided to the amplifier input, and the amplifier output is connected to the load, the load being a capacitive load, and
   a dual feedback configuration comprising a feedback resistor and a current sensor feedback arrangement,
   the feedback resistor being connected between the amplifier output and the amplifier input and providing a voltage feedback path,
   the current sensor feedback arrangement providing a current feedback path from the amplifier output to the amplifier input, and comprising:
   a current sensor resistor connected in an output current path of the driver circuit arrangement, and a current feedback amplifier with inputs connected to the current sensor resistor and an output connected to the amplifier input;

the current sensor resistor has a resistor value equal to $R_{EXT}/N$, wherein $R_{EXT}$ is an output impedance value associated with a predetermined signal transfer function of the driver circuit arrangement, and N is an amplification factor of the current feedback amplifier.

2. The driver circuit arrangement according to claim 1, wherein the output impedance value $R_{EXT}$ has a value between 5Ω and 10Ω.

3. The driver circuit arrangement according to claim 1, wherein the amplification factor N has a value between 10 and 1000.

4. The driver circuit arrangement according to claim 1, wherein the amplification factor N has a value of 200.

5. The driver circuit arrangement according to claim 1, wherein the capacitive load has a value between 1 μF and 8 μF.

6. The driver circuit arrangement according to claim 1, wherein the amplifier input comprises an input inverting terminal and input non-inverting terminal, and the amplifier output comprises an output inverting terminal and output non-inverting terminal, wherein the feedback resistor is connected between the output non-inverting terminal and the inverting input terminal, and the current sensor feedback arrangement is connected between the output inverting terminal and the input non-inverting terminal.

7. The driver circuit arrangement according to claim 1, wherein the amplifier input comprises an input inverting terminal and input non-inverting terminal, and the amplifier output comprises an output inverting terminal and output non-inverting terminal, the input non-inverting terminal being connected to ground wherein the feedback resistor is connected between the output non-inverting terminal and the inverting input terminal, and the current sensor feedback arrangement is connected between the output inverting terminal and the input inverting terminal.

8. The driver circuit arrangement according to claim 7, wherein the current feedback amplifier has a secondary multiplication factor equal to $N/R_{FB}$, $R_{FB}$ being the value of the feedback resistor, and N has a value between 10 and 1000.

9. The driver circuit arrangement according to claim 7, wherein the current feedback amplifier has a secondary multiplication factor equal to $N/R_{FB}$, $R_{FB}$ being the value of the feedback resistor, and N has a value of 200.

10. The driver circuit arrangement according to claim 1, further comprising an external inductor connected between the amplifier output and the load, wherein the external inductor is configured to tune a frequency response of a combination of external inductor and the load.

11. The driver circuit arrangement according to claim 1, wherein the load is a piezo-electric driver, and/or a piezo-electric loudspeaker.

12. The driver circuit arrangement according to claim 1, wherein the load is a piezo-electric loudspeaker and the piezo-electric loudspeaker is attached to the back of a smartphone display.

13. A differential drive arrangement for driving a load having two terminals, comprising a driver circuit arrangement according to claim 1 for each of the two terminals.

14. The differential drive arrangement according to claim 13, the driver circuit arrangements having positive and negative voltage swings.

15. The differential drive arrangement according to claim 13, wherein the load is driven with opposite phase signals.

16. A driver circuit arrangement for driving a load, comprising an amplifier with an amplifier input and an amplifier output, wherein in operation an input signal is provided to the amplifier input, and the amplifier output is connected to the load, the load being a capacitive load, and a dual feedback configuration comprising a feedback resistor and a current sensor feedback arrangement, the feedback resistor being connected between the amplifier output and the amplifier input and providing a voltage feedback path, the current sensor feedback arrangement providing a current feedback path from the amplifier output to the amplifier input, and comprising:

a current sensor resistor connected in an output current path of the driver circuit arrangement, and a current feedback amplifier with inputs connected to the current sensor resistor and an output connected to the amplifier input;

the amplifier is a class-D amplifier having a high side power FET connected to the amplifier output and to a supply voltage via a high side current path and a low side power FET connected to the amplifier output and to a ground via a low side current path, the current sensor resistor of the current sensor feedback arrangement being provided in series between the load and the ground.

17. The driver circuit arrangement according to claim 16, wherein the class-D amplifier comprises a second order or higher PWM feedback loop.

18. A driver circuit arrangement for driving a load, comprising an amplifier with an amplifier input and an amplifier output, wherein in operation an input signal is provided to the amplifier input, and the amplifier output is connected to the load, the load being a capacitive load, and a dual feedback configuration comprising a feedback resistor and a current sensor feedback arrangement, the feedback resistor being connected between the amplifier output and the amplifier input and providing a voltage feedback path, the current sensor feedback arrangement providing a current feedback path from the amplifier output to the amplifier input, and comprising:

a current sensor resistor connected in an output current path of the driver circuit arrangement, and a current feedback amplifier with inputs connected to the current sensor resistor and an output connected to the amplifier input;

the amplifier is a class-D amplifier having a high side power FET connected to the amplifier output and to a supply voltage via a high side current path and a low side power FET connected to the amplifier output and to a ground via a low side current path, wherein both the high side current path and the low side current path are provided with a current sensor feedback arrangement.

19. The driver circuit arrangement according to claim 18, wherein the class-D amplifier comprises a first order PWM feedback loop.

20. The driver circuit arrangement according to claim 18, wherein the class-D amplifier comprises a second order or higher PWM feedback loop.

* * * * *